US00RE39527E

(19) United States
(12) Reissued Patent
Brombacher et al.

(10) Patent Number: US RE39,527 E
(45) Date of Reissued Patent: Mar. 27, 2007

(54) METHOD AND APPARATUS FOR MEASURING A LOW POWER SIGNAL

(75) Inventors: Volker Brombacher, Pfintzal (DE); Fritz Bek, Pfintzal (DE)

(73) Assignee: Agilent Technologies, Inc., Palo Alto, CA (US)

(21) Appl. No.: 10/956,015

(22) Filed: Sep. 30, 2004

Related U.S. Patent Documents

Reissue of:
(64) Patent No.: 6,660,991
Issued: Dec. 9, 2003
Appl. No.: 10/095,235
Filed: Mar. 11, 2002

(30) Foreign Application Priority Data

Aug. 1, 2001 (EP) ..... 01118467

(51) Int. Cl.
*H01J 40/14* (2006.01)
*H03F 3/08* (2006.01)

(52) U.S. Cl. ..... 250/214 R; 250/214 A; 356/215

(58) Field of Classification Search ..... 250/206, 250/214 R, 214 A, 214 B, 214 DC, 214 C, 250/214 LA, 559.01; 327/113, 9, 63, 74, 327/269, 278, 281, 287–288, 514; 356/215, 356/221, 223, 226; 330/59, 308–309
See application file for complete search history.

(56) References Cited

U.S. PATENT DOCUMENTS 5,307,145 A * 4/1994 Schenkel et al. ..... 356/215
5,343,033 A * 8/1994 Cain ..... 250/208.2
5,773,816 A * 6/1998 Grodevant ..... 250/214 R
5,959,291 A * 9/1999 Jensen ..... 250/214 R
6,172,353 B1 * 1/2001 Jensen ..... 250/214 R
6,348,682 B1 * 2/2002 Lee ..... 250/214 A
6,384,401 B1 * 5/2002 Jensen ..... 250/214 R
6,660,991 B2 * 12/2003 Brombacher et al. ... 250/214 R

FOREIGN PATENT DOCUMENTS

DE 3322471 A1 * 3/1985

OTHER PUBLICATIONS

Clevorn, J., Examiner. European Search Report,Application No. EP 01 11 8467, dated Jan. 9, 2002.*

* cited by examiner

*Primary Examiner*—Stephone B. Allen
*Assistant Examiner*—Patrick J. Lee

(57) ABSTRACT

Low intensity light is incident upon a photodiode whose output is coupled to an integrator. The output of the integrator is coupled to an input of an A/D converter, whose output is coupled to a microprocessor, whose output is coupled to a filter. A second output of the microprocessor is coupled to a gate electrode of a FET to provide a reset signal to the FET to reset the integrator. The microprocessor compares the digital samples of the integrated signal from the A/D converter and, firstly, generates the reset signal if a sample is beyond a set limit, and, secondly, calculates delta values between adjacent samples and interpolates the delta values for the reset periods so as to provide a continuous data stream which can be filtered by a filter matched to the form of the original signal.

13 Claims, 5 Drawing Sheets

METHOD AND APPARATUS FOR MEASURING A LOW POWER SIGNAL

Matter enclosed in heavy brackets [ ] appears in the original patent but forms no part of this reissue specification; matter printed in italics indicates the additions made by reissue.

DESCRIPTION

1. Field of the Invention

This invention relates, in general, to a method and apparatus for measuring a low power signal, and more particularly to a method and apparatus for measuring a low power signal based on a low light signal, for example a low light signal from a photo diode.

2. Background of the Invention

In many systems, a light receiving device, such as a photo diode, photo avalanche diode or photomultiplier tube, emits an electric signal based on the amount of light (number of light photons) incident on a light sensitive portion of the light receiving device. In order to then provide a useful signal providing an indication of the amount of light incident on the device, the electric signal from the device is integrated over predetermined time periods, filtered, converted to a digital signal and then suitably processed.

One known way of carrying out this processing is known from U.S. Pat. No. 5,959,291 (Jensen) in which a photodiode is coupled across positive and negative input terminals of an operational amplifier, the positive input terminal of the operational amplifier being coupled to ground and a capacitor and a field effect transistor being coupled, in parallel, between the negative input terminal and the output of the operational amplifier, the gate of the transistor serving as a reset signal. The output of the operational amplifier is coupled to the input of a low-pass filter, whose output is coupled to an input of an analog-to-digital (A/D) converter. A microprocessor receives as input the digitised output of the a/d converter.

The above circuit operates by receiving and integrating a signal from the photo diode and then resetting the integrator. The circuit then filters out the higher frequencies in the integrated signal, and converts the analog filtered integrated signal to digital samples. Finally, the circuit calculates an integration slope for the photo diode signal by fitting a curve to the digital samples. With the calculated slopes, the circuit is better able to determine the original noiseless signal from the photo diode. The circuit takes many readings per integration period (which is of fixed predetermined length) and uses sophisticated curve-calculation methods, such as, for example, least-squares curve fitting, to generate the per-period calculated slopes.

Disadvantages of the above circuit are that, for high light intensities, the signal is saturated before the predetermined integration time is over and the detector skips the signal after saturation until the next reset. On the other hand, for low light intensities, the reset may occur more frequently than necessary so that the whole dynamic range of the AND converter is not used. Furthermore, every reset is a disturbance which needs valuable measurement time to settle until the system is stable again (This may take as much as 10% of the time).

It is therefore an object of the present invention to provide a method and apparatus for measuring a low power signal, for example from a photo diode, which overcomes, or at least reduces the disadvantages of the known method described above.

BRIEF SUMMARY OF THE INVENTION

Accordingly, in a first aspect, the present invention provides a method of measuring a low power signal, comprising the steps of:

receiving a low power signal from a signal source;

integrating the received low power signal over controllable integration periods to provide an integration signal;

sampling the integration signal at a frequency substantially higher than a frequency of the integration periods to provide digital samples of the integration signal;

determining differences between digital samples to provide a stream of delta values; and filtering the stream of delta values to provide a filtered signal substantially matching the received low power signal.

In a preferred embodiment of the invention, the method further comprises the step of interpolating the delta values between integration periods so that the stream of delta values is continuous.

Preferably, the digital samples are compared to a predetermined value and the integration period is reset if a digital sample has a value which is not within the predetermined value.

In a second aspect, the invention provides an apparatus for measuring a low power signal, comprising:

an input terminal for receiving a low power signal from a signal source;

an integrator coupled to the input terminal and having an output for providing an integration signal formed by integrating the received low power signal over controllable integration periods;

a digitiser coupled to an output of the integrator for sampling the integration signal at a frequency substantially higher than a frequency of the integration periods to provide digital samples of the integration signal at an output;

a processing means having an input coupled to the output of the digitiser for determining differences between digital samples to provide a stream of delta values at an output; and a filter having an input coupled to the output of the comparator for filtering the stream of delta values to provide a filtered signal substantially matching the received low power signal at an output.

In a preferred embodiment of the invention, the processing means includes interpolation means for interpolating the delta values between integration periods so that the stream of delta values is continuous.

Preferably, processing means includes comparison means for comparing the digital samples to a predetermined value and for providing a reset signal to the integrator for resetting the integration period if a digital sample has a value which is not within the predetermined value.

BRIEF DESCRIPTION OF THE DRAWINGS

An embodiment of the present invention will now be described, by way of example, with reference to the accompanying drawings, of which.

DETAILED DESCRIPTION OF THE DRAWINGS

Figure 1:
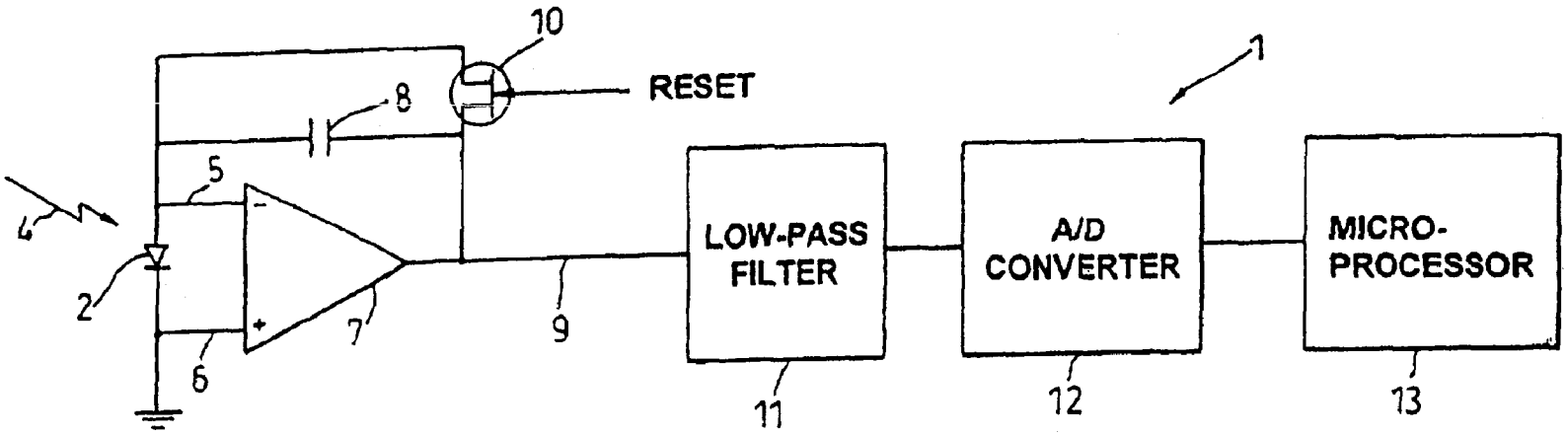
Fig. 1 (Prior Art)
FIG. 1 is a schematic drawing of a known circuit for measuring a low power signal.

Thus, FIG. 1 shows a known circuit 1 for measuring a low power signal from a photodiode 2 when light of relatively low intensity (indicated by arrow 4) is incident upon the photodiode 2. The photodiode 2 is coupled between a negative input 5 and a positive input 6 of an operational amplifier 7. A capacitor 8 is coupled in a feedback path between an output 9 of the operational amplifier 7 and its negative input 5. A field effect transistor (FET) 10 has its source electrode coupled to the output 9 of the operational amplifier 7 and its drain electrode coupled to the negative input 5 of the operational amplifier 7, with its gate electrode serving to receive a reset signal to reset the operational amplifier 7.

The output 9 of the operational amplifier 7 is coupled to an input of a low-pass filter 11, whose output is, in turn, coupled to an input of an analog-to-digital converter (A/D) 12. An output of the A/D converter 12 is coupled to an input of a microprocessor 13, whose output provides an indication of the measured signal, and hence of the light incident on the photo diode 2.

The operational amplifier 7 receives and integrates the signal from the photodiode 2 over an integration period set by a reset signal received by the FET 10. The reset signal has a predetermined frequency so that the integration periods are constant. The low-pass filter 11 then filters out the higher frequencies in the integrated signal and the A/D converter 12 digitises the filtered integrated signal. Finally, the microprocessor 13 calculates the integration slope for the photo diode signal by fitting a curve to the digitised samples, for example using a least-squares fit algorithm.

Figure 3A:
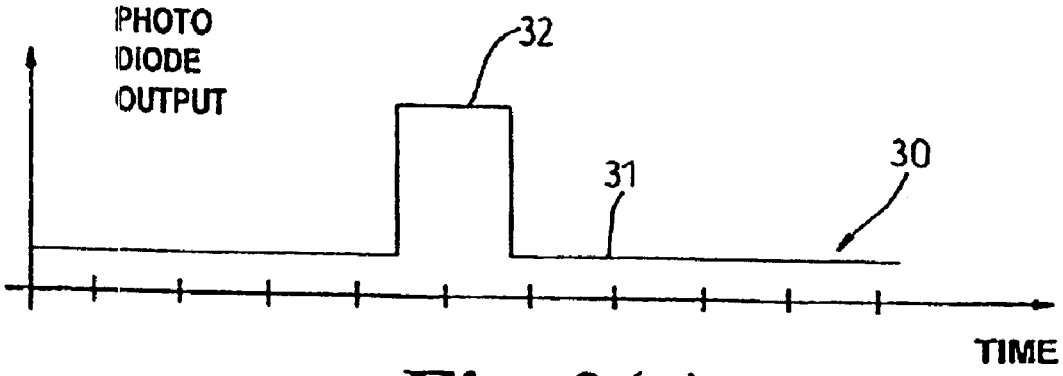
Fig. 3(a) (Prior Art)
FIG. 3 shows a set of schematic signal graphs for the circuit of FIG. 1.
Figure 3B:
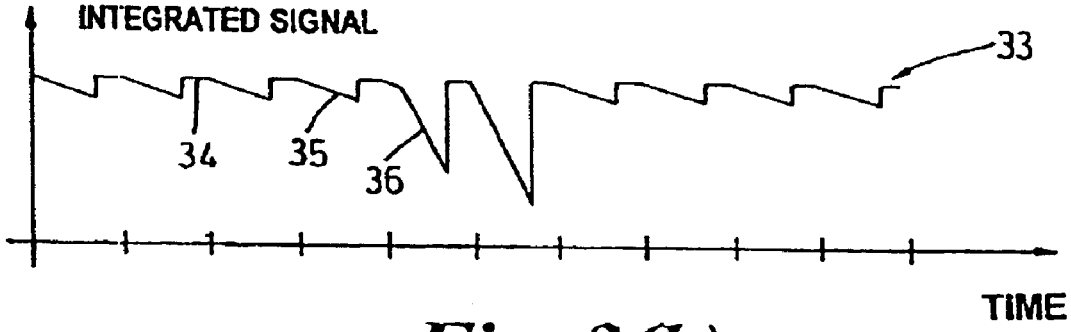
Fig. 3(b) (Prior Art)
Figure 3C:
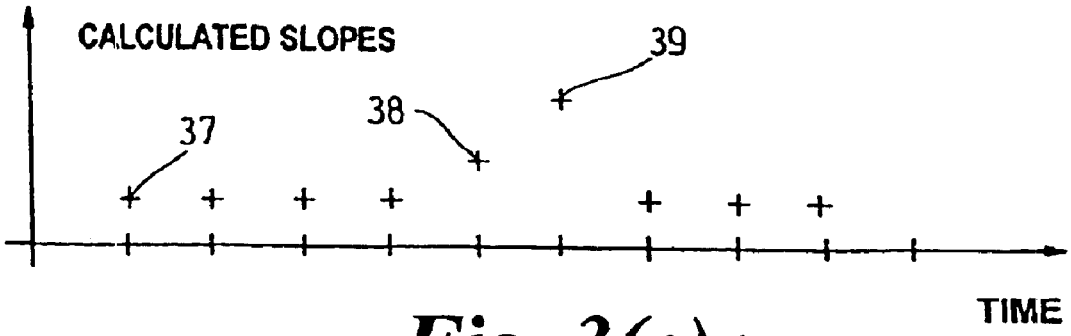
Fig 3(c) (Prior Art)
Figure 4A:
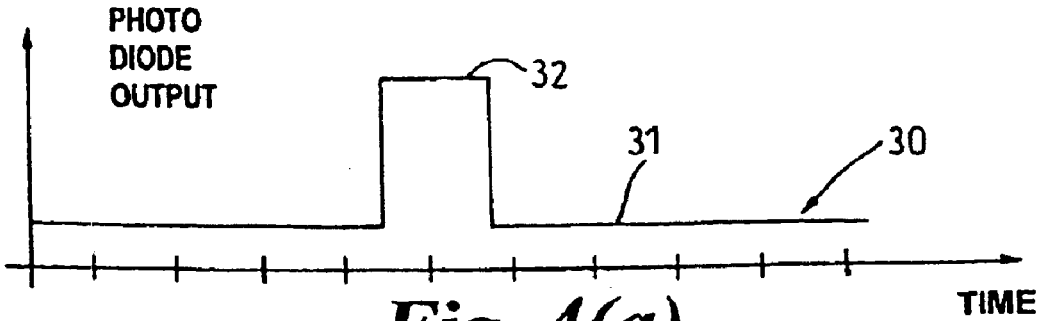
FIG. 4 shows a set of schematic signal graphs for the apparatus of FIG. 2.
Figure 4B:
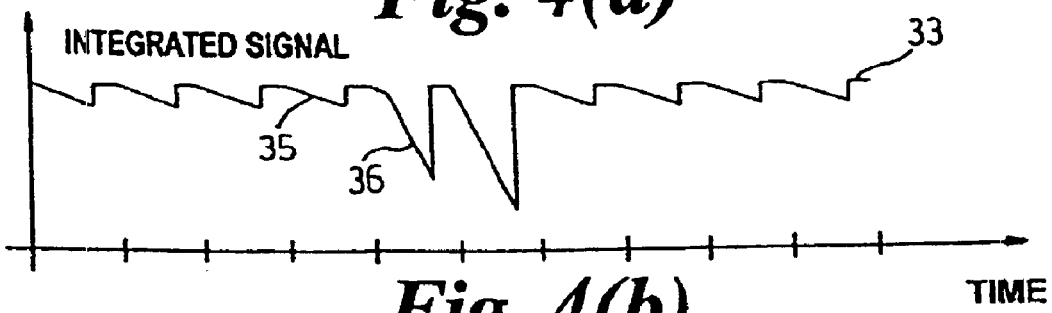
Figure 4C:
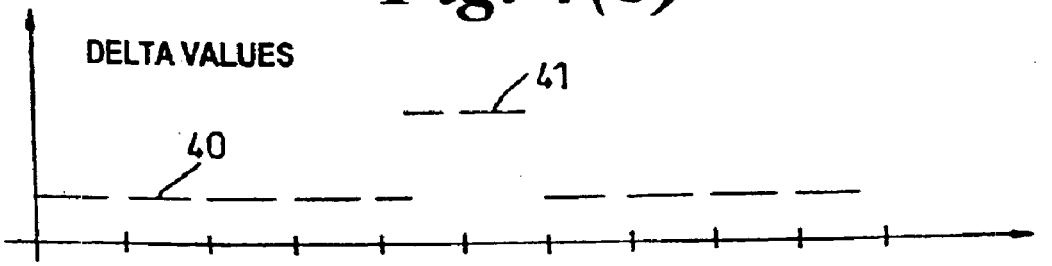
Figure 4D:
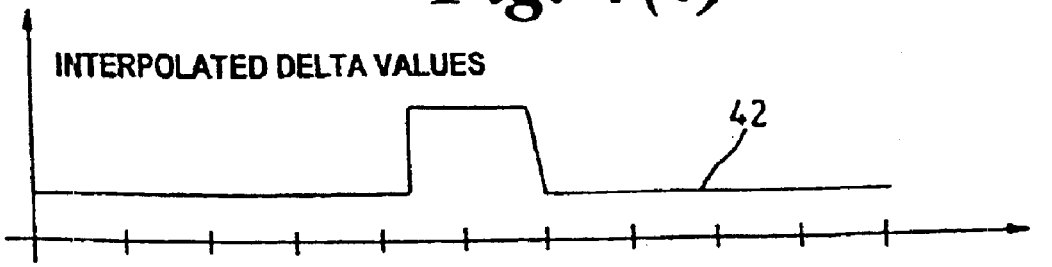
Figure 4E:
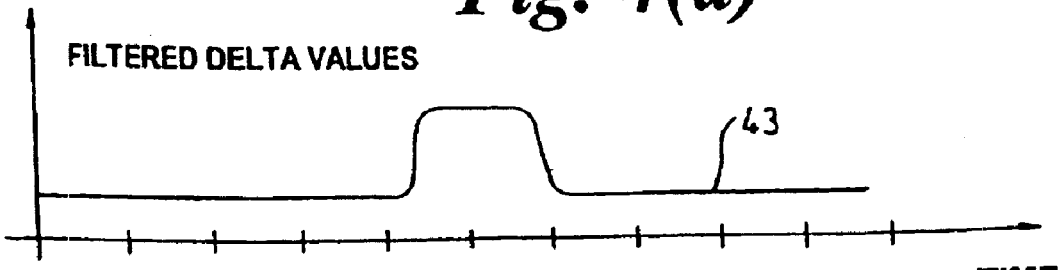
Figure 5A:
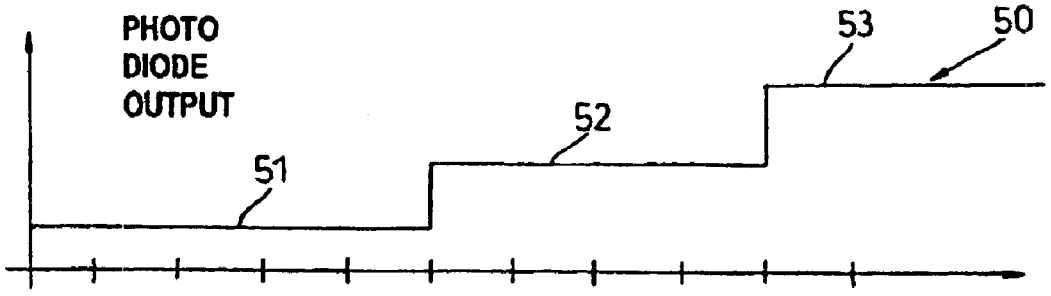
FIG. 5 shows a set of schematic signal graphs for the apparatus of FIG. 2 with a different form of light intensity distribution of that of FIG. 4.
Figure 5B:
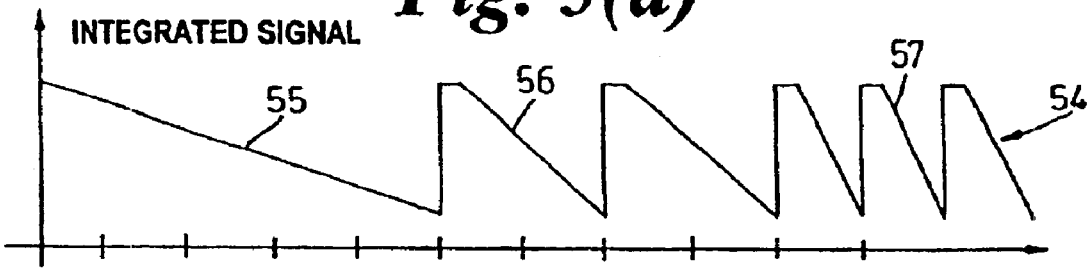
Figure 5C:
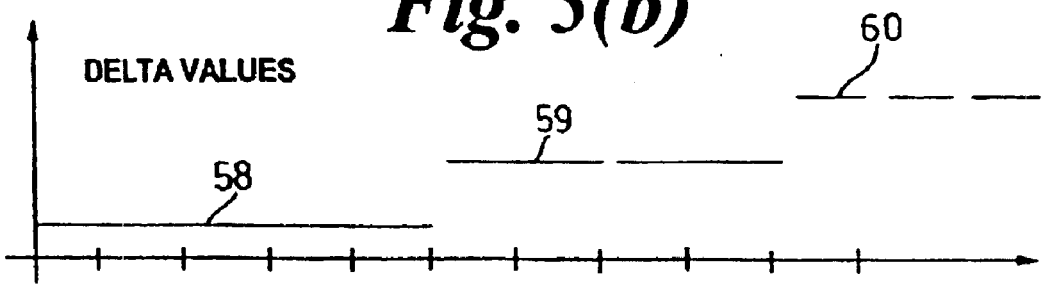
Figure 5D:
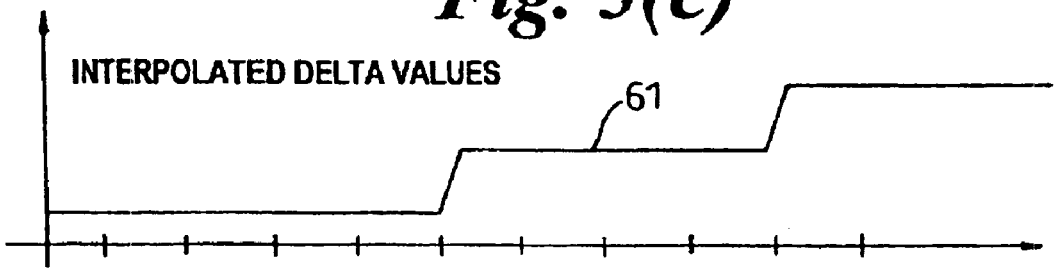
Figure 5E:
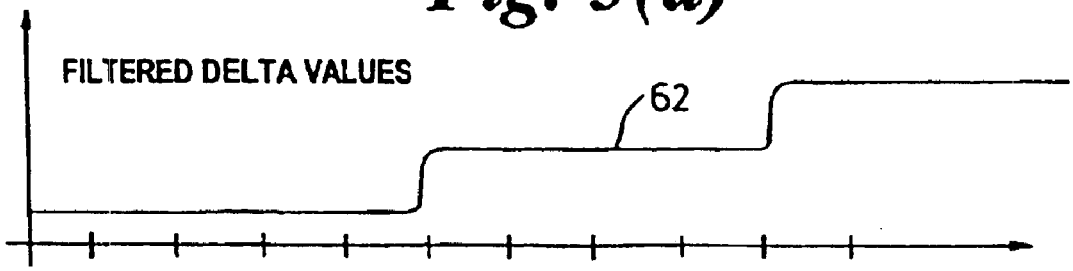

In operation, and referring now to FIG. 3, the graph of FIG. 3(*a*) shows a plot of an output signal 30 of the photo diode, which represents the light intensity incident on the photo diode over a period of time. In this case, there is a background light level 31, which suddenly increases to a high level 32 when light is incident on the photo diode and then drops back down to the background level when the light is no longer incident on the photo diode. The operational amplifier 7 receives and integrates the output signal from the photodiode 2 over an integration period set by a reset signal received by the FET 10. As can be seen in FIG. 3(*b*), the operational amplifier provides an integrated output signal 33 which includes a short reset period. This takes place by charging the capacitor 8 to an initial charged level, which is the upper level 34 shown in FIG. 3(*b*). When no light is incident on the photo diode, the capacitor slowly discharges through the operational amplifier, which is shown as shallow slope 35, until the reset signal is received by the FET and the capacitor is recharged back to the initial charged level 34. When the output signal from the photo diode is at the high level 32, the capacitor discharges more quickly through the operational amplifier so that the slope 36 is steeper. As before, when the rest signal is received by the FET, the capacitor is recharged back to the initial charged level 34. The A/D converter 12 samples the integrated signal at a frequency rate substantially higher than the integration period frequency and provides a stream of these samples to the microprocessor 13.

The samples for an integration period are stored and then a slope that best fits the samples is calculated during the reset periods. This is shown in FIG. 3(*c*), where the calculated slopes are indicated by crosses. In this case, while there is only background light incident on the photo diode, the shallow slopes 35 of the integrated signal are constant, as shown by crosses 37. When the incident light reaches the high level 32 during an integration period, as shown in FIG. 3(*b*), the slope changes from shallow to steep during the period so that the best fit slope for the period is an average of the two, as shown by cross 38 in FIG. 3(*c*). When the incident light is at the high level 32 for the whole of an integration period, the calculated slope for the period has a high value, as shown by cross 39 in FIG. 3(*c*). It will be apparent that timing and rate of change information is lost for the time when light incident on the photo diode changes.

As mentioned above, in the above circuit the signal is saturated before the predetermined integration time is over for high light intensities and the detector skips the signal after saturation until the next reset. On the other hand, for low light intensities, the reset may occur more frequently than necessary so that the whole dynamic range of the A/D converter is not used. Furthermore, every reset is a disturbance which needs valuable measurement time to settle until the system is stable again (this may take as much as 10% of the time).

Figure 2:
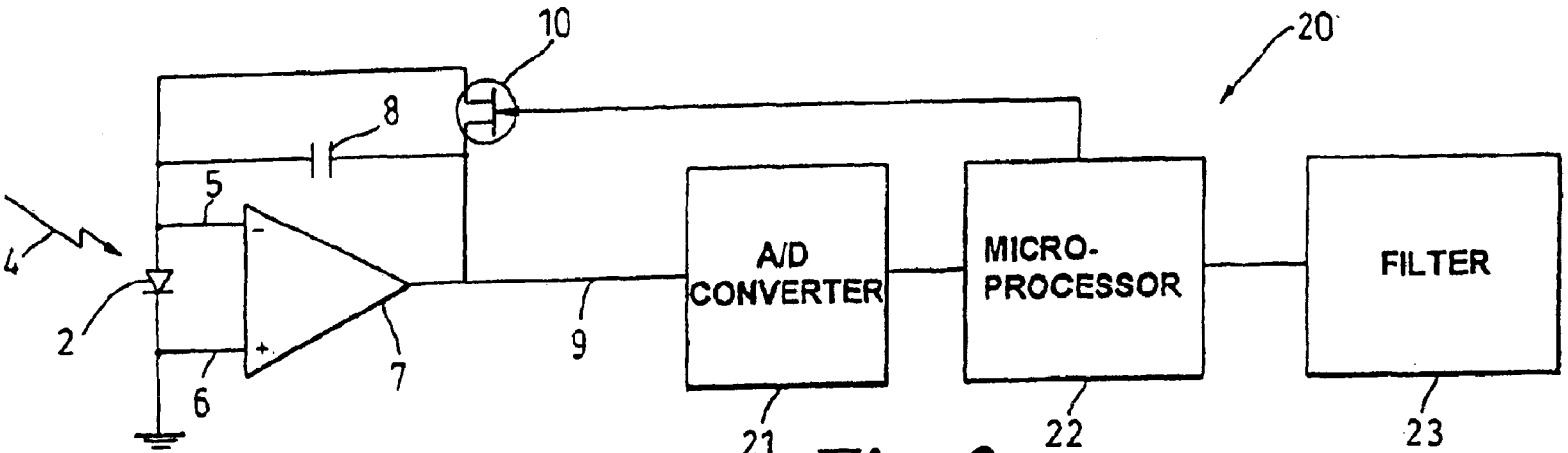
FIG. 2 is a schematic drawing of an apparatus for measuring a low power signal according to a first embodiment of the invention.

FIG. 2 shows an apparatus 20 according to a preferred embodiment of the present invention. In the drawing, the same elements as shown in FIG. 1 are given the same reference numerals. More particularly, light of relatively low intensity (indicated by arrow 4) is incident upon the photodiode 2. The photodiode 2 is coupled between the negative input 5 and the positive input 6 of the operational amplifier 7. Capacitor 8 is coupled in a feedback path between output 9 of the operational amplifier 7 and its negative input 5. Field effect transistor (FET) 10 has its source electrode coupled to the output 9 of the operational amplifier 7 and its drain electrode coupled to the negative input 5 of the operational amplifier 7, with its gate electrode serving to receive a reset signal to reset the operational amplifier 7.

However, according to the present embodiment of the invention, the output 9 of the operational amplifier 7 is coupled to an input of an analog-to-digital (A/D) converter 21. An output of the A/D converter 21 is coupled to an input of a microprocessor 22, whose output is coupled to an input of a filter 23. A second output of the microprocessor 22 is coupled to the gate electrode of FET 10 to provide the reset signal to the FET 10.

In operation, and referring now to FIG. 4, the graphs of FIGS. 4(*a*) and 4(*b*) are identical to those of FIGS. 3(*a*) and 3(*b*) and show the output signal 30 of the photo diode, which represents the light intensity incident on the photo diode over a period of time with a background light level 31 and a high level 32 as well as the integrated output signal 33. As before, the A/D converter 21 samples the integrated signal at a frequency rate substantially higher than the integration period frequency and provides a stream of these samples to the microprocessor 22.

However, according to the present embodiment of the invention, instead of storing the samples for a complete integration period and then calculating a best-fit curve (slope) to the samples, in this embodiment of the invention, delta values are calculated between each adjacent sample. A delta value is the difference between one sample and the next. A plot of the delta value is shown in FIG. 4(*c*), where, as can be seen, for each of the slopes 35 and 36, there is a different delta value 40 and 41, respectively. It will be appreciated that the delta values 40 and 41 are each constant because slopes 35 and 36 are constant slopes, so that adjacent samples of the slopes have a constant difference.

In order to provide a continuous stream of data samples to the filter 23, delta values are interpolated for the reset periods, shown as gaps in the delta value graph of FIG. 4(*c*). The interpolated delta value plot 42 is shown in FIG. 4(*d*) where the gaps are filled in with interpolated values calculated by the microprocessor 22 based on any suitable interpolation algorithm. In the present case a simple linear interpolation scheme is used. Such an estimation is generally acceptable if the number of estimated points is considerably lower (<10%) than the number of measured points.

The continuous stream of data samples from microprocessor 22 is then passed to the filter 23, which can be a weighted filter that matches the form of the signal, for example a Savitszki-Golay filter can be used where the signal has Gaussian peaks. The output of the filter 23 is shown in FIG. 4(*e*), where, as can be seen, the signal is a good representation of the original photo diode output signal 30.

Although the above examples shows the integration period as a constant predetermined period, with the reset signal being applied at a constant frequency, as mentioned above, resetting the apparatus, even when the integrator has not reached saturation, simply disturbs the system unnecessarily.

Figure 6:
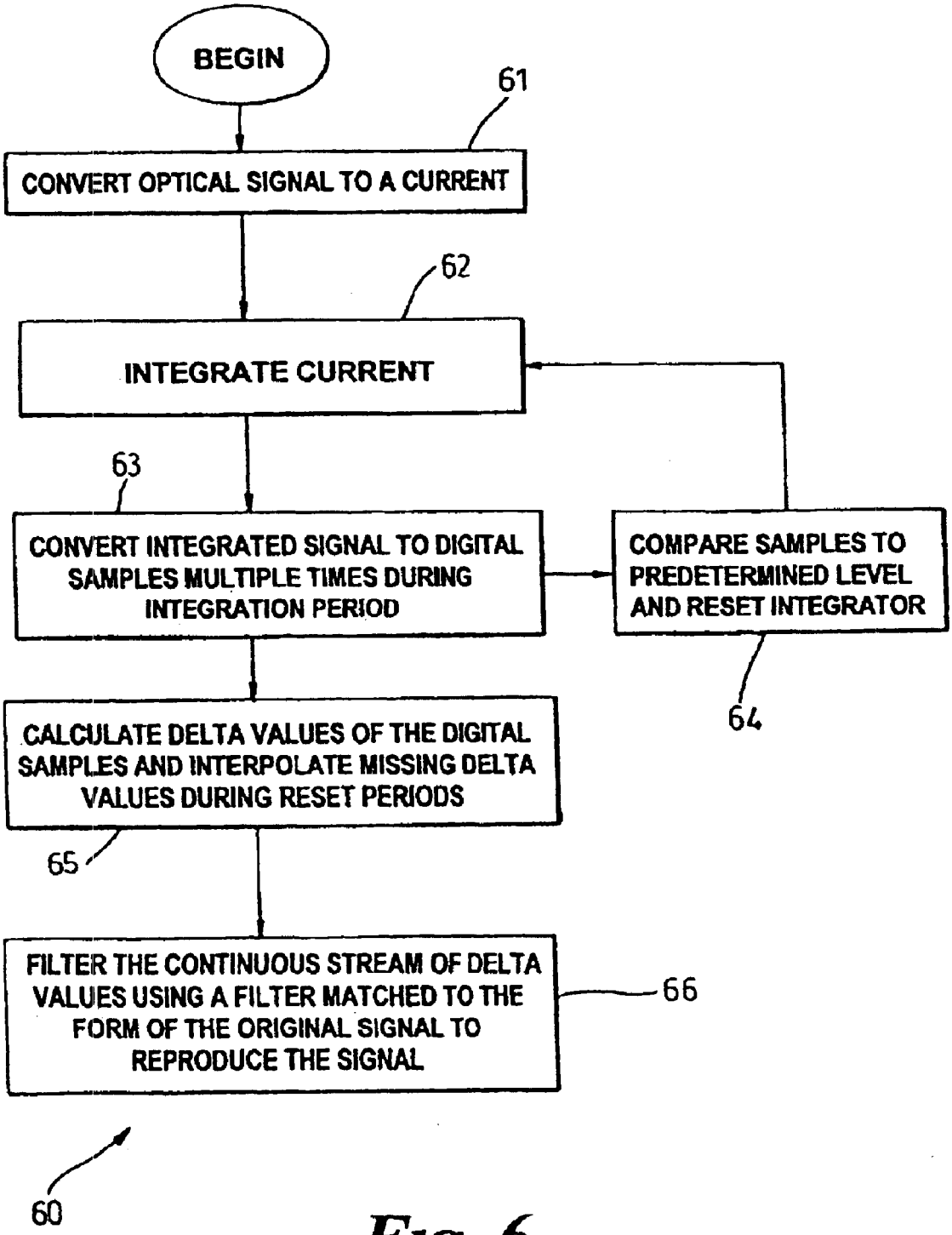
FIG. 6 shows a schematic flow chart of the operation of the apparatus of FIG. 2.

Therefore, according to the preferred embodiment of the apparatus, and as illustrated in the flow chart 60 of FIG. 6, the apparatus first receives the optical light signal at the photo diode and converts it (step 61) to an electrical current signal. The current signal is then integrated (step 62) the integrated signal is sampled by the A/D converter at a much higher frequency than the integration period to provide a steam of digital data samples (step 63). The microprocessor 22 then compares the samples from the A/D converter 21 to a predetermined value, which is stored in a memory (not shown) to which the microprocessor is coupled and generates the reset signal applied to the gate electrode of FET 10 when a sample is found to be at or higher than the predetermined value (step 64). In this way, the apparatus is not reset until the integrator approaches saturation so that, firstly, the apparatus is not disturbed until necessary, and, secondly, at high light levels, the integration periods are short and the signal is "lost" only for the reset period itself, rather than for all the remaining integration period after the integrator has reached saturation, as in the prior art circuit with fixed integration periods.

The microprocessor 22 also calculates the differences between adjacent samples to produce delta values during the integration periods and also interpolates the delta values for the reset periods to produce a continuous stream of delta values (step 65). The continuous stream of delta values is then filtered by a Savitszki-Golay filter to produce a reconstruction of the original signal (step 66).

Low intensity light is incident upon a photodiode whose output is coupled to an integrator. The output of the integrator is coupled to an input of an A/D converter, whose output is coupled to a microprocessor, whose output is coupled to a filter. A second output of the microprocessor is coupled to a gate electrode of a FET to provide a reset signal to the FET to reset the integrator. The microprocessor compares the digital samples of the integrated signal from the A/D converter and, firstly, generates the reset signal if a sample is beyond a set limit, and, secondly, calculates delta values between adjacent samples and interpolation the delta values for the reset period so as to provide a continuous data stream which can be filtered by a filter matched to the form of the original signal.

The delta values between the digitised samples of the integration signal 54 are shown in FIG. 5(*c*), where delta values 58, 59 and 60 corresponding to integration signal slopes 55, 56 and 57, respectively. As before, the gaps in the delta values to the reset periods are then interpolated by the microprocessor to provide a continuous steam of data samples, shown as the interpolated signal 61 in FIG. 5(*d*), which are then filtered by the filter to provide a filtered representation 62 of the original signal 50.

Thus, the embodiment of the invention described above provides a dynamic reset which depends only on signal level and not on a fixed time, and achieving a continuous stream of equidistant data by interpolating the delta values for the reset periods so that a weighted filter can be used. The advantages of a dynamic reset are that at high light levels the time intervals between the resets are short and the signal is lost only during the reset period itself, whereas at low light levels the reset occurs only if the integrator is about to go into saturation and this means that there is factor of about 20 fewer reset cycles at typical low light intensities.

By having an equidistant continuous stream of data under all light conditions, any suitable filter can be used and a fixed time period for the measurement can be avoided. Thus, the filter firmware can be optimised for a wide range of frequency behaviour of the signal without changing the hardware. Furthermore, by sampling during the whole slope, instead of resetting after every point as in a standard A/D converter, rounding errors introduced by digitising the signal are compensated with the following values because the integrating capacitor accumulates charge without rounding errors. Finally, the output data rate of the system becomes independent of the reset frequency so that at high light levels the system is not "blind" for a considerable percentage of the cycle time.

Whilst only one particular embodiment of the invention has been described above, it will be appreciated that a person skilled in the art can make modifications and improvements without departing from the scope of the present invention.

What is claimed is:

1. A method of measuring a low power signal, comprising:

receiving a low power signal from a signal source;

integrating the received low power signal over controllable integration periods to provide an integration signal;

sampling the integration signal at a frequency substantially higher than a frequency of the integration periods to provide digital samples of the integration signal;

determining differences between digital samples to provide a stream of delta values; and filtering the stream of delta values to provide a filtered signal substantially matching the received low power signal.

2. A method of measuring a low power signal according to claim 1, further comprising interpolating the delta values between integration periods so that the stream of delta values is continuous.

3. A method of measuring a low power signal according to claim 1, further comprising comparing the digital samples to a predetermined value and resetting the integration period if a digital sample has a value greater than the predetermined value.

4. An apparatus for measuring a low power signal, comprising:

an input terminal for receiving a low power signal from a signal source;

an integrator coupled to the input terminal and having an output for providing an integration signal formed by integrating the received low power signal over controllable integration periods;

a digitiser coupled to the output of the integrator for sampling the integration signal at a frequency substantially higher than a frequency of the integration periods to provide digital samples of the integration signal at an output;

a processing means having an input coupled to the output of the digitiser for determining differences between digital samples to provide a stream of delta values at an output; and a filter having an input coupled to the output of the processing means for filtering the stream of delta values to provide a filtered signal substantially matching the received low power signal at an output.

5. An apparatus for measuring a low power signal according to claim 4, wherein the processing means includes interpolation means for interpolating the delta values between integration periods so that the stream of delta values is continuous.

6. An apparatus, for measuring a low power signal according to claim 4, wherein the integrator comprises an operational amplifier having a first input coupled to the first terminal and an output, a capacitor coupled between the first input and the output of the operational amplifier, and a transistor having current electrodes coupled between the first input and the output of the operational amplifier and a control electrode for receiving a reset signal for controlling the integration periods.

7. An apparatus for measuring a low power signal according to claim 6, wherein the transistor is a Field Effect Transistor.

8. An apparatus for measuring a low power signal according to claim 6, wherein the processing means includes comparison means for comparing the digital samples to a predetermined value and for providing the reset signal for resetting integration period if a digital sample has a value greater than the predetermined value.

9. An apparatus for measuring a low power signal according to claim 4, wherein the digitiser comprises an analog-to-digital converter.

10. An apparatus for measuring a low power signal according to claim 4, wherein the filter is matched to the form of the low power signal.

11. An apparatus for measuring a low power signal according to claim 10, wherein the filter is a Savitszki-Golay filter.

12. *A method of measuring a low power signal, comprising:*

*receiving a low power signal from a signal source;*

*integrating the received low power signal over controllable integration periods to provide an integration signal;*

*sampling the integration signal at a frequency substantially higher than a frequency of the integration periods to provide digital samples of the integration signal;*

*comparing the digital samples to a predetermined value; and*

*resetting the integration period when a value of a digital value exceeds the predetermined value.*

13. *A method of measuring a low power signal, comprising:*

*receiving a low power signal from a signal source;*

*integrating the received low power signal over controllable integration periods to provide an integration signal;*

*sampling the integration signal at a frequency substantially higher than a frequency of the integration periods to provide digital samples of the integration signal;*

*comparing the digital samples to a predetermined value; and*

*resetting the integration period if a digital sample has a value greater than the predetermined value.*

* * * * *